(12) United States Patent
Binder et al.

(10) Patent No.: US 11,874,298 B2
(45) Date of Patent: Jan. 16, 2024

(54) SENSOR DEVICES WITH AT LEAST ONE BENT CONNECTION CONDUCTOR AND METHODS FOR PRODUCING THE SENSOR DEVICES

(71) Applicant: Infineon Technologies AG, Neubiberg (DE)

(72) Inventors: Gernot Binder, Klagenfurt (AT); Ferdinand Gastinger, Woelfnitz (AT); Stephanie Jankowski, Regensburg (DE); Thomas Lassleben, Beratzhausen (DE)

(73) Assignee: Infineon Technologies AG, Neubiberg (DE)

( * ) Notice: Subject to any disclaimer, the term of this patent is extended or adjusted under 35 U.S.C. 154(b) by 164 days.

(21) Appl. No.: 17/196,101

(22) Filed: Mar. 9, 2021

(65) Prior Publication Data
US 2021/0285980 A1    Sep. 16, 2021

(30) Foreign Application Priority Data

Mar. 12, 2020   (DE) .......................... 102020106802.6

(51) Int. Cl.
| | |
|---|---|
| *G01P 3/487* | (2006.01) |
| *G01D 5/14* | (2006.01) |
| *G01D 11/24* | (2006.01) |
| *G01R 33/00* | (2006.01) |

(52) U.S. Cl.
CPC .............. *G01P 3/487* (2013.01); *G01D 5/147* (2013.01); *G01D 11/245* (2013.01); *G01R 33/0047* (2013.01)

(58) Field of Classification Search
CPC ...... G01D 11/245; G01D 5/147; G01P 3/487; G01R 33/0047; G01R 33/072; G01R 33/091
See application file for complete search history.

(56) References Cited

U.S. PATENT DOCUMENTS

| | | | |
|---|---|---|---|
| 4,926,122 A | 5/1990 | Schroeder et al. | |
| 5,581,179 A | 12/1996 | Engel et al. | |
| 7,385,394 B2 * | 6/2008 | Auburger ................ | G01P 3/488 |
| | | | 361/813 |
| 2013/0249544 A1 | 9/2013 | Vig et al. | |
| 2016/0018476 A1 | 1/2016 | Ooi et al. | |
| 2020/0284623 A1 | 9/2020 | Ausserlechner et al. | |
| 2021/0199469 A1 * | 7/2021 | Ito ............................ | G01D 5/12 |

FOREIGN PATENT DOCUMENTS

| | | | | |
|---|---|---|---|---|
| DE | 19620548 A1 | 12/1996 | | |
| DE | 102004060297 A1 | 6/2006 | | |
| DE | 102004060298 A1 * | 6/2006 | ............... | G01D 5/14 |
| DE | 102016009005 A1 | 2/2017 | | |
| EP | 0361456 A2 | 4/1990 | | |
| JP | 4308084 B2 * | 8/2009 | | |

* cited by examiner

*Primary Examiner* — Jay Patidar
(74) *Attorney, Agent, or Firm* — Harrity & Harrity, LLP

(57) ABSTRACT

A sensor device includes a magnetic field sensor component, including a chip carrier having a connection conductor and a magnetic field sensor chip arranged on the chip carrier, and a magnet, wherein the magnetic field sensor component is arranged on a mounting surface of the magnet, wherein the mounting surface has an elevation and the connection conductor is bent around the elevation.

17 Claims, 8 Drawing Sheets

US 11,874,298 B2

SENSOR DEVICES WITH AT LEAST ONE BENT CONNECTION CONDUCTOR AND METHODS FOR PRODUCING THE SENSOR DEVICES

RELATED APPLICATION

This application claims priority to German Patent Application No. 102020106802.6, filed on Mar. 12, 2020, which is incorporated herein by reference in its entirety.

FIELD

The present disclosure relates to sensor devices and methods for producing sensor devices.

BACKGROUND

Sensor devices can comprise magnetic field sensor components having magnetically sensitive sensor elements. The magnetic field sensor components can be mounted on a magnet that provides a magnetic supporting field. By way of example, such sensor devices in combination with a ferromagnetic wheel can be designed to detect wheel speeds in automotive applications. Manufacturers of sensor devices are constantly endeavoring to improve their products and associated production methods. In particular, in this context it may be desirable to provide sensor devices having improved mechanical stability and simplified methods for producing such sensor devices.

SUMMARY

One aspect of the disclosure relates to a sensor device. The sensor device comprises a magnetic field sensor component, including a chip carrier having a connection conductor and a magnetic field sensor chip arranged on the chip carrier. The sensor device furthermore includes a magnet, wherein the magnetic field sensor component is arranged on a mounting surface of the magnet, wherein the mounting surface has an elevation and the connection conductor is bent around the elevation.

A further aspect of the disclosure relates to a sensor device. The sensor device includes a magnetic field sensor component, including a chip carrier having a connection conductor and a magnetic field sensor chip arranged on the chip carrier. The sensor device furthermore includes a magnet, wherein the magnetic field sensor component is arranged on a mounting surface of the magnet, wherein the mounting surface has a depression and the magnetic field sensor component is arranged in the depression.

A further aspect of the disclosure relates to a method for producing a sensor device. The method includes providing a magnetic field sensor component, including a chip carrier having a connection conductor and a magnetic field sensor chip arranged on the chip carrier. The method furthermore includes arranging the magnetic field sensor component on a mounting surface of a magnet, wherein the mounting surface has an elevation. The method furthermore includes bending the connection conductor around the elevation of the mounting surface.

BRIEF DESCRIPTION OF THE DRAWINGS

Sensor devices and methods for producing sensor devices in accordance with the disclosure are explained in greater detail below with reference to drawings. The elements shown in the drawings are not necessarily rendered in a manner true to scale relative to one another. Identical reference signs may designate identical components.

DETAILED DESCRIPTION

Figure 1:
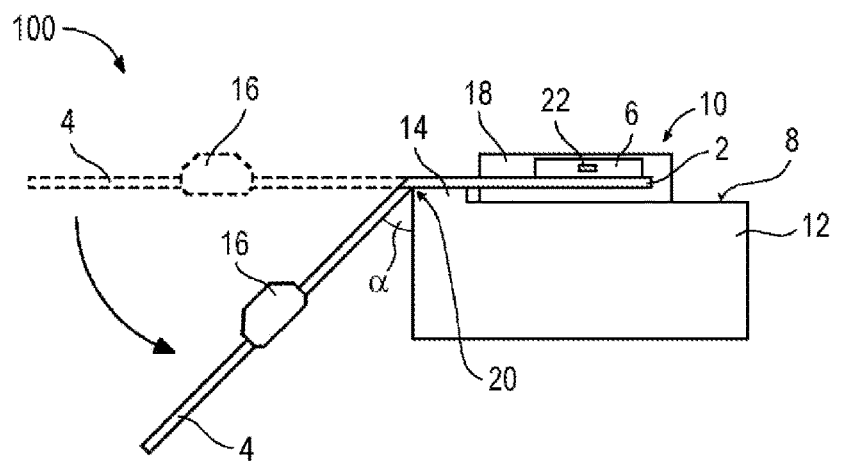
FIG. 1 shows a side view of a sensor device 100 in accordance with the disclosure.

The sensor device 100 in FIG. 1 can comprise a magnetic field sensor component 10 comprising a chip carrier 2 having one or more connection conductors 4 and a magnetic field sensor chip 6 arranged on the chip carrier 2. The magnetic field sensor chip 6 can comprise one or more sensor elements 22. The magnetic field sensor component 10 can be arranged on a mounting surface 8 of a magnet 12. The mounting surface 8 can have an elevation 14, and the connection conductor(s) 4 can be bent around the elevation 14. For the purpose of elucidation, FIG. 1 additionally illustrates the connection conductor(s) 4 in an unbent state, i.e. before a bending process, using dashed lines. The sensor device 100 can furthermore comprise an optional passive component 16, which can be arranged on the connection conductor 4. The magnetic field sensor chip 6 and further components of the sensor device 100 can be encapsulated by an encapsulation material 18. In other words, the encapsulation material 18 can form a housing for the magnetic field sensor chip 6, such that the sensor device 100 can also be referred to as a sensor package.

The magnet 12 can be magnetized in the z-direction, for example. In this case, the north pole of the magnet 12 can be arranged above the south pole of the magnet 12, or vice versa. The magnet 12 can be a block magnet, in particular. The magnet 12 can be designed to provide a magnetic supporting field for the operation of the sensor device 100. The magnet 12 can be referred to as a back-bias magnet. In particular, the magnet 12 can be designed to generate a defined magnetic offset field at the sensor elements 22 of the magnetic field sensor chip 6.

The magnetic field sensor chip 6 can generally comprise one or more sensor elements 22. In particular, the magnetic field sensor chip 6 can comprise a mono-Hall sensor element 22, which can be designed to detect the strength of a magnetic field present at the sensor element 22. The main surfaces of the magnetic field sensor chip 6 can lie in the x-y-plane. The sensor element 22 can be designed for example to detect a magnetic field component in the z-direction. In other words, the sensor element 22 can be sensitive relative to magnetic field components in the z-direction. In further examples, the magnetic field sensor chip 6 can be an xMR sensor that is sensitive in the z-direction, in particular an AMR sensor, a GMR sensor or a TMR sensor.

The magnetic field sensor chip 6 can be mounted on the chip carrier 2 by a main surface. The chip carrier 2 can be produced from copper, nickel, aluminum, or high-grade steel, for example. In one example, the chip carrier 2 can be a leadframe, which can comprise a diepad and the connection conductors 4. Only one connection conductor 4 is discernible in FIG. 1, on account of the perspective chosen. However, the sensor device 100 can comprise any desired number of further connection conductors 4.

The magnetic field sensor chip 6 can be electrically connected to one or more of the connection conductors 4. The connection conductors 4 can at least partly project from the encapsulation material 18, such that the magnetic field sensor chip 6 can be electrically contacted from outside the encapsulation material 18. The encapsulation material 18 can be fabricated from a laminate, an epoxy resin, a thermoplastic or a thermosetting polymer, for example. In particular, the encapsulation material 18 can be fabricated by means of a molding process. The magnetic field sensor component 10 or its package body (or housing body) can be secured to the magnet 12, for example by means of an adhesive layer (not shown). The magnet 12 can constitute a discrete component, i.e. it need not necessarily be encapsulated by the encapsulation material 18.

The passive component 16 can comprise a capacitor, for example, which is designed for at least one of the following: providing a supply voltage of the magnetic field sensor component 10, providing an ESD protection for the magnetic field sensor component 10, or providing an electromagnetic compatibility of the magnetic field sensor component 10.

The connection conductor(s) 4 can be bent from a first, unbent position into a second, bent position by applying a force acting in the z-direction (cf. arrow). In the example in FIG. 1, an angle α between the connection conductor 4 and the left side wall of the magnet 12 can have a value of approximately 45 degrees. In further examples, the value of the angle α can also be greater, in particular approximately 90 degrees. In the example in FIG. 1, the bending process need not necessarily have already been concluded. In some examples, the connection conductor 4 can additionally be bent around the edge formed by the left side wall and the underside of the magnet 12 (cf. FIG. 13, for example). The sensor device 100 can be electrically and mechanically connected to a circuit board (not shown) by means of the connection conductor 4. The shape of the bent connection conductor 4 can depend on an envisaged arrangement or securing of the sensor device 100 on the circuit board.

Mechanical stresses can occur during the bending of the connection conductor 4, and can lead to cracks in the encapsulation material 18. Furthermore, delamination or damage of an adhesive layer arranged between the magnetic field sensor component 10 and the magnet 12 can occur. If the magnetic field sensor chip 6 is encapsulated by the encapsulation material 18 only after the bending of the connection conductor 4, additional stresses can occur during the encapsulation process. The elevation 14 of the magnet 12 can function as a supporting surface during the bending process and avoid or at least reduce the abovementioned mechanical stresses and thus damage of the sensor device 100.

In conventional sensor devices, the mechanical stresses can be reduced by using a clamping tool. In that case, the connection conductor(s) 4 can be clamped in the clamping tool on its/their top side and underside, such that forces that occur during a bending process can be absorbed by the clamping tool. On account of the explained use of the elevation 14 as a bearing surface, during the bending of the connection conductors 4 it is possible to dispense with the use of such a clamping tool in accordance with the present disclosure. One process step can thus be saved in comparison with the fabrication of conventional sensor devices.

In the example in FIG. 1, the connection conductor 4 can bear on the elevation 14 during and after the bending process. That is to say that the underside of the connection conductor 4 can mechanically contact the top side of the elevation 14. In further examples, the connection conductor 4 can bear on the elevation 14 only during the bending process. A minimum interspace between the connection conductor 4 and the elevation 14 can remain after the bending process.

The connection conductor 4 can be bent around an edge 20 formed by the upper surface and the left side wall of the magnet 12. In the example in FIG. 1, said edge 20 is embodied as substantially right-angled. In further examples, the edge 20 can be rounded. This makes it possible to avoid damage to the connection conductor 4 caused by the edge 20 during the bending process.

In one example, the magnet 12 and the elevation 14 can be fabricated as a one-piece integral part. The magnet 12 and the elevation 14 can thus consist of an identical material and have no connecting points. In a further example, the magnet 12 and the elevation 14 can consist of two parts joined together. In this case, the magnet 12 and the elevation 14 can initially be present as separate components and be mechanically connected to one another by means of a suitable process. In this case, the magnet 12 and the elevation 14 can consist of an identical material or different materials.

Figure 2A:
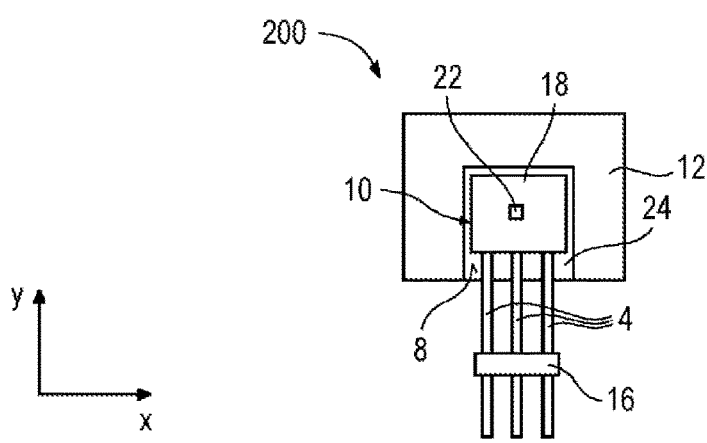
FIGS. 2A to 2C show a plan view and two side views of a sensor device 200 in accordance with the disclosure.
Figure 2B:
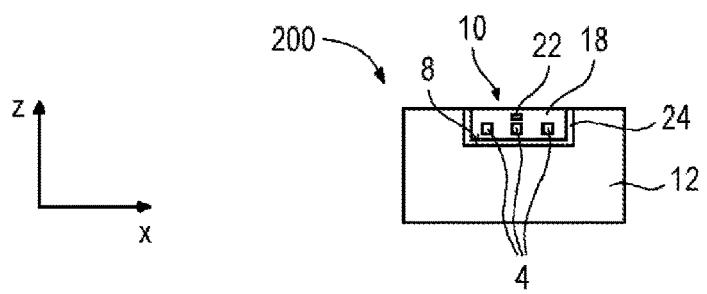
Figure 2C:
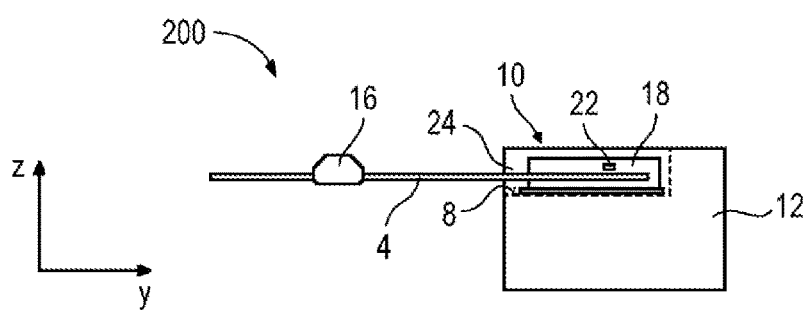

The sensor device 200 in FIGS. 2A-2C can be at least partly similar to the sensor device 100 from FIG. 1 and comprise similar components. For the sake of simplicity, FIGS. 2A-2C do not illustrate a magnetic field sensor chip of the magnetic field sensor component 10, but rather only a sensor element 22. In the example in FIGS. 2A-2C, the magnetic field sensor component 10 can comprise three connection conductors 4. The three connection conductors 4 can be a supply voltage connection, a ground connection and an output connection, for example. A mounting surface 8 of the magnet 12 can have a depression 24 and the magnetic field sensor component 10 can be arranged in the depression 24. In the plan view in FIG. 2A, the magnet 12 and the magnetic field sensor component 10 can each have a rectangular shape. The depression 24 can be formed by way of a U-shaped elevation on the mounting surface 8 of the magnet 12. The side walls of the depression 24 can surround the magnetic field sensor component 10 on three sides. In general, the side walls of the depression 24 can surround the magnetic field sensor component 10 on at least two sides.

On account of the arrangement of the magnetic field sensor component 10 in the depression 24, a translation and/or a rotation of the magnetic field sensor component 10 in the mounting surface 8 can be substantially blocked. In order to provide as effective a blockage as possible, a basic area of the depression 24 and a basic area of the magnetic field sensor component 10 can be substantially congruent (cf. e.g. FIG. 2A). In the example in FIGS. 2A-2C, it is possible to block a rotation of the magnetic field sensor component 10 in the x-y-plane, translations of the magnetic field sensor component 10 in the positive and negative x-direction, and also a translation of the magnetic field sensor component 10 in the positive y-direction. The blockade can prevent damage to an adhesive layer between the magnetic field sensor component 10 and the magnet 12, said damage being caused by shear forces, for example. The shear forces can occur for example during an encapsulation process, such as a molding process, for example.

During mounting of the magnetic field sensor component 10 on the magnet 12, the depression 24 can provide an improved alignment and guidance of the magnetic field sensor component 10. The depression 24 makes it possible to prevent undesired translations and rotations of the magnetic field sensor component 10 in the mounting surface 8 and to achieve a precise alignment of the magnetic field sensor component 10 or of the sensor element 22 relative to the magnet 12. As a result, the sensor element 22 can be exposed to a well-defined magnetic offset field. An offset deviation of individual devices produced ("Part-to-part Offset Variation") on account of assembly tolerances can be reduced.

Figure 3A:
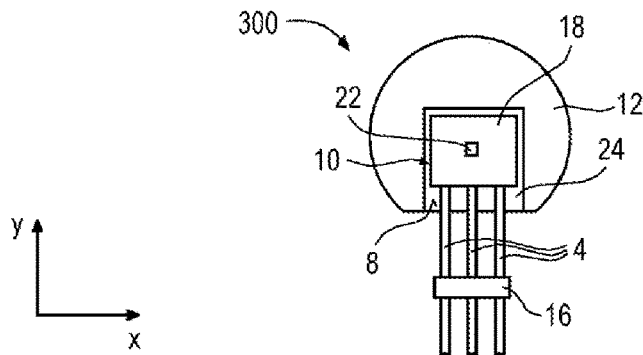
FIGS. 3A to 3C show a plan view and two side views of a sensor device 300 in accordance with the disclosure.
Figure 3B:
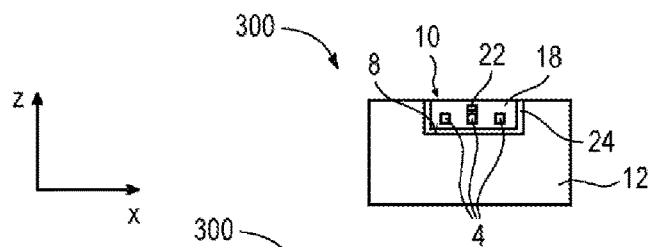
Figure 3C:
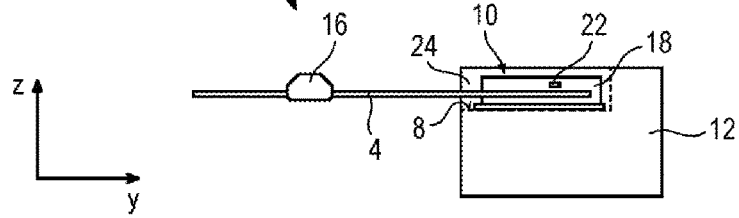

The sensor device 300 in FIGS. 3A-3C can be at least partly similar to the sensor device 200 from FIGS. 2A-2C and comprise similar components. In contrast to FIGS. 2A-2C, the magnet 12 in the plan view in FIG. 3A can have an (at least partly) round or circular shape. The magnet 12 can thus be embodied as (at least partly) cylindrical. Such a shape of the magnet 12 can be suitable for example for sensor devices for detecting the rotational speed of a camshaft. A further sensor device in accordance with the disclosure having a round or circular basic area is shown and discussed in FIGS. 11 and 12. The side walls of the depression 24 can surround the magnetic field sensor component 10 on three sides.

Figure 4A:
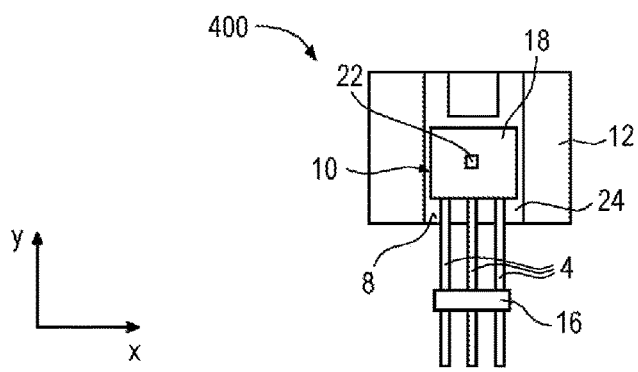
FIGS. 4A to 4C show a plan view and two side views of a sensor device 400 in accordance with the disclosure.
Figure 4B:
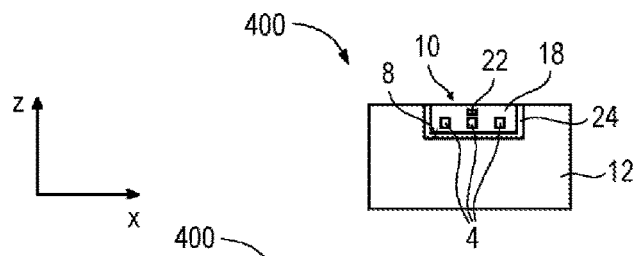
Figure 4C:
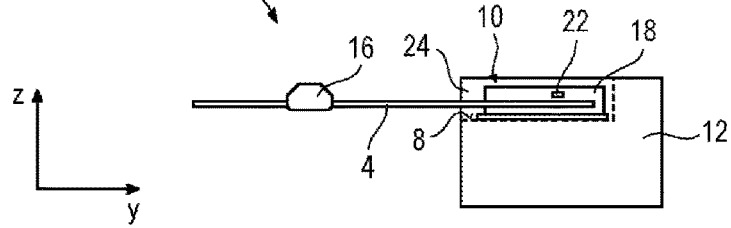

The sensor device 400 in FIGS. 4A-4C can be at least partly similar to the sensor device 200 from FIGS. 2A-2C and comprise similar components. In contrast to FIGS. 2A-2C, the depression 24 in FIGS. 4A-4C can be formed by way of a plurality of elevations on the mounting surface 8 of the magnet 12. In the plan view in FIG. 4A, two elongate rectangular elevations can be arranged at the right and left sides of the magnetic field sensor component 10 and a rectangular or substantially square elevation can be arranged at the top side of the magnetic field sensor component 10.

Figure 5A:
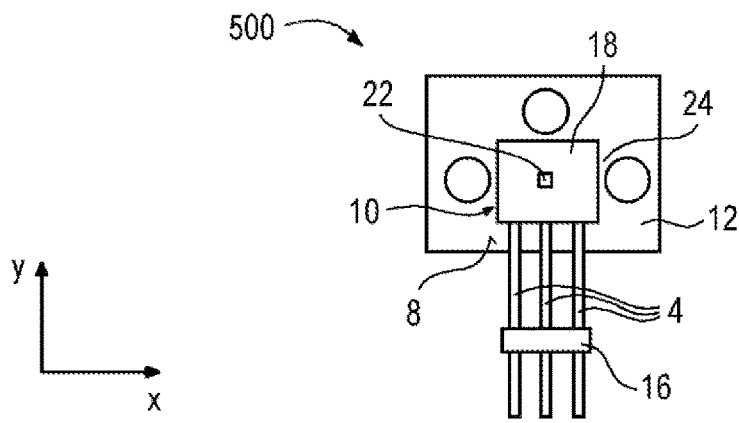
FIGS. 5A to 5C show a plan view and two side views of a sensor device 500 in accordance with the disclosure.
Figure 5B:
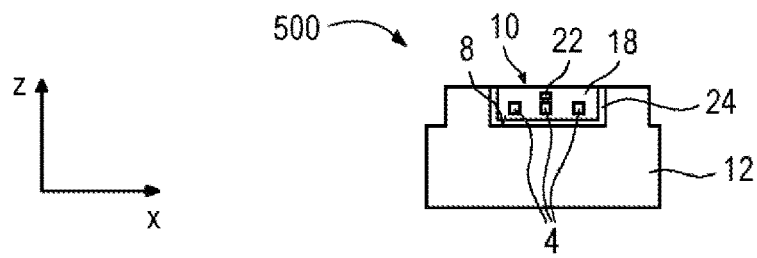
Figure 5C:
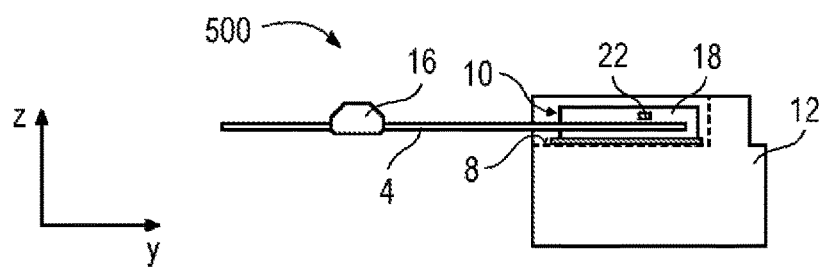

The sensor device 500 in FIGS. 5A-5C can be at least partly similar to the sensor device 400 from FIGS. 4A-4C and comprise similar components. In contrast to FIGS. 4A-4C, the elevations on the mounting surface 8 of the magnet 12 can have a different geometric shape. In the plan view in FIG. 5A, the elevations can each have a round or circular shape and thus be embodied in the form of a cylinder. Three cylindrical elevations are shown in the example in FIGS. 5A-5C. In further examples, the number of elevations can deviate, in particular, can be higher. In general, the depression 24 or the elevations that form it can have any other geometric shape as long as, on account of the arrangement of the magnetic field sensor component 10 in the depression 24, a translation and/or a rotation of the magnetic field sensor component 10 in the mounting surface 18 are/is substantially blocked.

Figure 6:
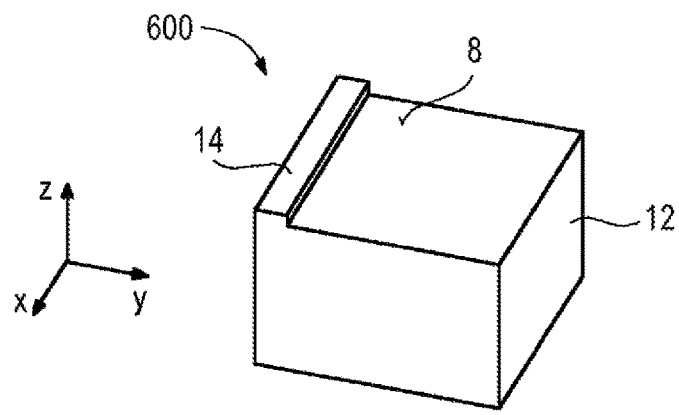
FIG. 6 shows a perspective view of a magnet 600 that can be used in a sensor device in accordance with the disclosure.

FIG. 6 shows a magnet 600 that can be used in a sensor device in accordance with the disclosure. By way of example, the magnet 600 can be used in the sensor device 100 in FIG. 1. The elevation 14 can be embodied in the shape of a beam and extend along a marginal region of the mounting surface 8. In the example in FIG. 6, the elevation 14 can be arranged along an edge or at a marginal region of the mounting surface 8. In further examples, the elevation 14 can extend along two or three or four edges of the mounting surface 8. In one example, the elevation 14 can be produced by means of an additive process, in which the material of the elevation 14 is added to the material of the magnet 12. In a further example, the elevation 14 can be produced by means of a subtractive process, in which material of the magnet 12 is removed in order to form the elevation 14. The elevation 14 can have one or more rounded edges.

In the example in FIG. 6, the elevation 14 can be embodied in one piece or in continuous fashion. Consequently, a plurality or each of the connection conductors of a sensor device arranged on the magnet 12 can be bent around the one-piece elevation 14. In further examples, the elevation 14 can be interrupted once or a number of times. The mounting surface 8 of the magnet 12 can thus have a plurality of elevations. Each of the plurality of connection conductors of a sensor device can be bent around one of the plurality of elevations. In one specific example, one of the plurality of elevations can be arranged under each of the connection conductors.

Figure 7:
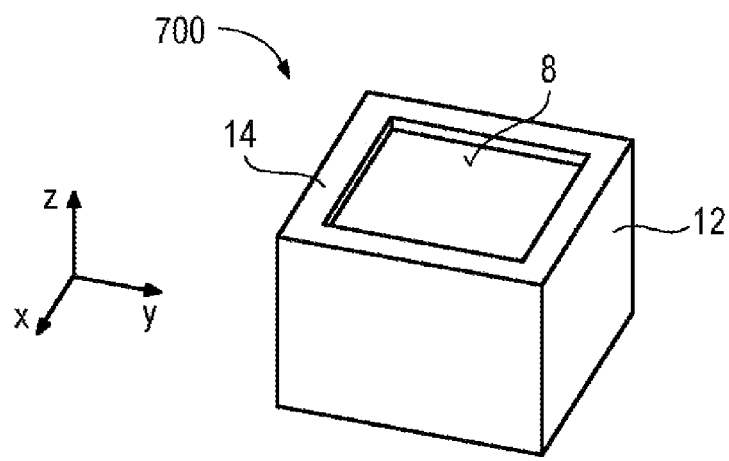
FIG. 7 shows a perspective view of a magnet 700 that can be used in a sensor device in accordance with the disclosure.

FIG. 7 shows a magnet 700 that can be used in a sensor device in accordance with the disclosure. The magnet 700 can be at least partly similar to the magnet 600 in FIG. 6. In contrast to FIG. 6, the elevation 14 can be embodied in the shape of a frame and extend around the mounting surface 8. In one example, the mounting surface 8 can initially be formed in a planar manner, and the elevation 14 can be formed by forming a depression in the planar mounting surface 8. In the example in FIG. 7, the elevation 14 can surround the mounting surface 8 completely and without interruptions. In further examples, the elevation 14 can be interrupted once or a number of times.

Figure 8:
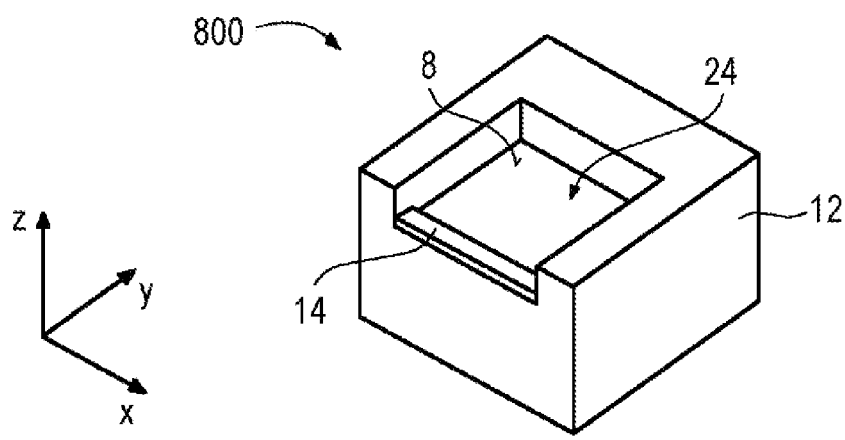
FIG. 8 shows a perspective view of a magnet 800 that can be used in a sensor device in accordance with the disclosure.

FIG. 8 shows a magnet 800 that can be used in a sensor device in accordance with the disclosure. The magnet 800 can be regarded for example as a combination of the magnet 12 from FIG. 6 and the magnet 12 from FIGS. 2A-2C. Firstly, the mounting surface 8 of the magnet 12 can have an elevation 14, around which connection conductors of a magnetic field sensor component mounted on the mounting surface 8 can be bent. Secondly, the mounting surface 8 can have a depression 24, in which a magnetic field sensor component can be arranged.

Figure 9:
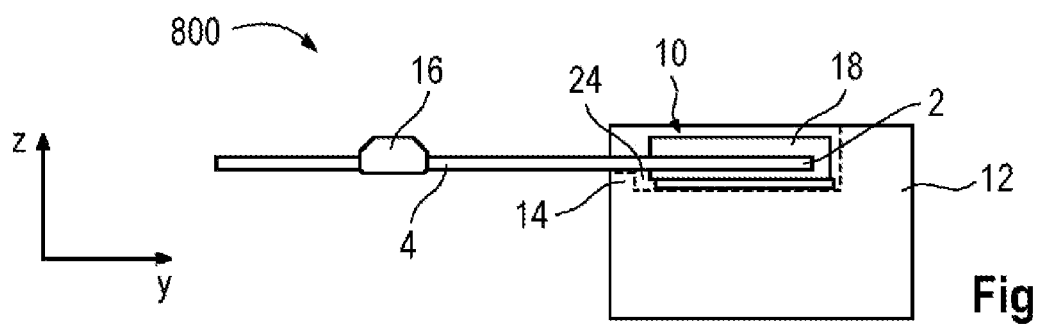
FIG. 9 shows a side view of a sensor device 900 in accordance with the disclosure.

The sensor device 900 in FIG. 9 can comprise for example the magnet 800 from FIG. 8 and the magnetic field sensor component 10 from FIGS. 2A-2C. In FIG. 9, the connection conductor(s) 4 of the magnetic field sensor component 10 has/have not yet been bent around the elevation 14 of the mounting surface 8. As already described above, it is possible to avoid damage to the magnetic field sensor component 10 or an adhesive layer between the magnetic field sensor component 10 and the magnet 12 during the bending of the connection conductors 4 on account of the elevation 14. In the example in FIG. 9, the magnetic field sensor component 10 can be completely surrounded by side walls of the depression 24. On account of that, a translation and/or a rotation of the magnetic field sensor component 10 in the mounting surface 8 can be substantially blocked.

Figure 10:
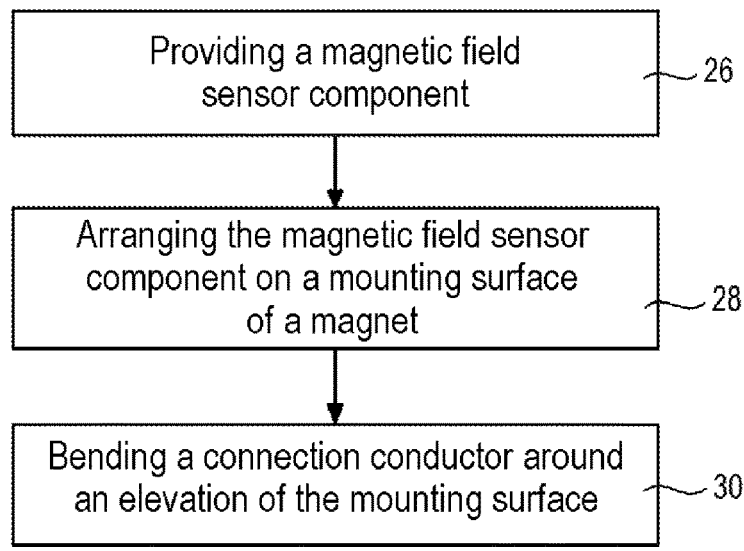
FIG. 10 shows a flow diagram of a method for producing a sensor device in accordance with the disclosure.

FIG. 10 shows a flow diagram of a method for producing a sensor device in accordance with the disclosure. In 26, a magnetic field sensor component, comprising a chip carrier having a connection conductor and a magnetic field sensor chip arranged on the chip carrier, can be provided. In 28, the magnetic field sensor component can be arranged on a mounting surface of a magnet, wherein the mounting surface has an elevation. In 30, the connection conductor can be bent around the elevation of the mounting surface.

Figure 11A:
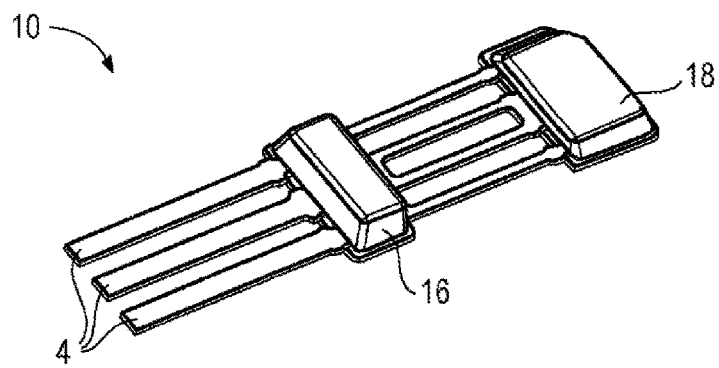
FIGS. 11A to 11C show a perspective view of a method for producing a sensor device 1100 in accordance with the disclosure.
Figure 11B:
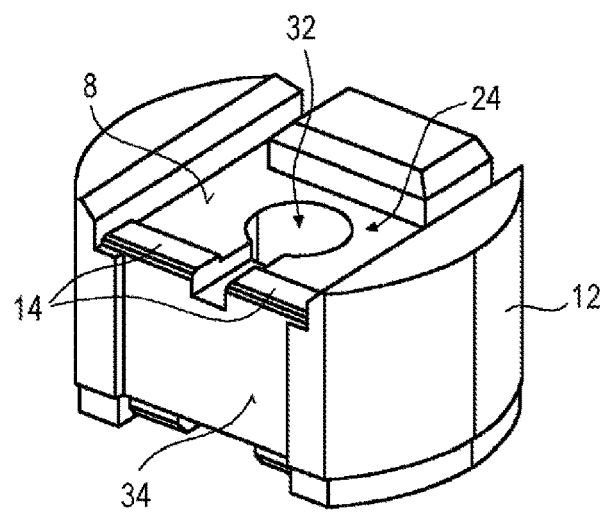
Figure 11C:
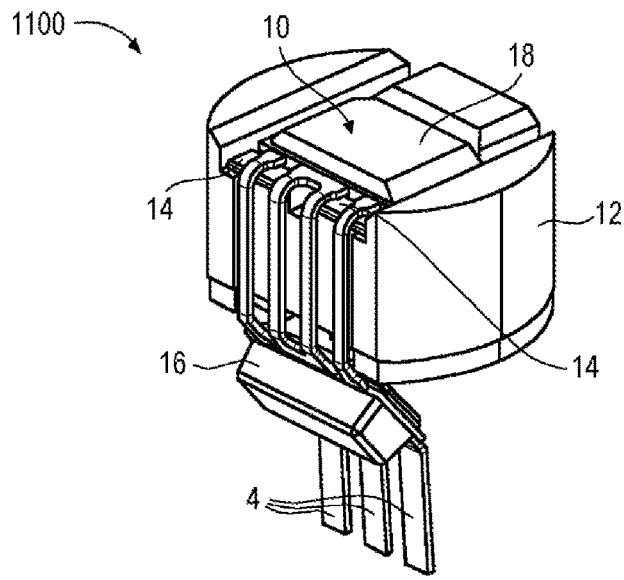

FIGS. 11A-11C show a perspective view of a method for producing a sensor device 1100 in accordance with the disclosure. The method in FIG. 11 can be similar to the method in FIG. 10.

In FIG. 11A, a magnetic field sensor component 10 can be provided, which can be similar to the magnetic field sensor component 10 in FIGS. 2A-2C, for example.

In FIG. 11B, a magnet 12 can be provided, which can have features of the magnet 12 in FIGS. 3A-3C and of the magnet 800 from FIG. 8. The magnet can have two elevations 14, around which connection conductors of a magnetic field sensor component can be bent. The mounting surface 8 can have a depression 24, in which the magnetic field sensor component can be arranged. In the example in FIG. 11B, the depression 24 can be formed by two elevations on the left and right, by one elevation at the top side, and also the two elevations 14 at the underside. The magnet 12 can be embodied as cylindrical, i.e. its geometry can be suitable in particular for sensor devices for detecting a camshaft rotational speed. The magnet 12 can have a hole (or a depression) 32, which can extend along a cylinder axis of the cylindrical magnet 12. In one example, the hole 32 can extend completely through the magnet 12 from its top side to its underside. In a further example, the hole 32 can extend from the top side into the magnet 32, but not extend completely as far as the underside of the magnet 12. The lateral surface of the cylindrical magnet 12 can be flattened at a side surface 34 of the magnet 12.

In FIG. 11C, the magnetic field sensor component 10 from FIG. 11A can be arranged in the depression 24 and over the hole 32 of the magnet 12 from FIG. 11B, for example in the context of a pick-and-place process. In a plan view of the mounting surface 8 of the magnet 12, in one example, the dimensioning of the hole 32 can substantially correspond to the dimensioning of the package body or of the encapsulation material 18. In the example in FIG. 11C, the height of the package body can substantially correspond to the depth of the depression 24. Afterward, the connection conductors 4 of the magnetic field sensor component 10 can be bent around the elevations 14 of the magnet 12 in a first bending process. The bent connection conductors 4 can extend along the flattened side surface 34 of the magnet 12. In a second bending process, the connection conductors 4 can be bent further around the lower edge of the flattened side surface 34.

Figure 12:
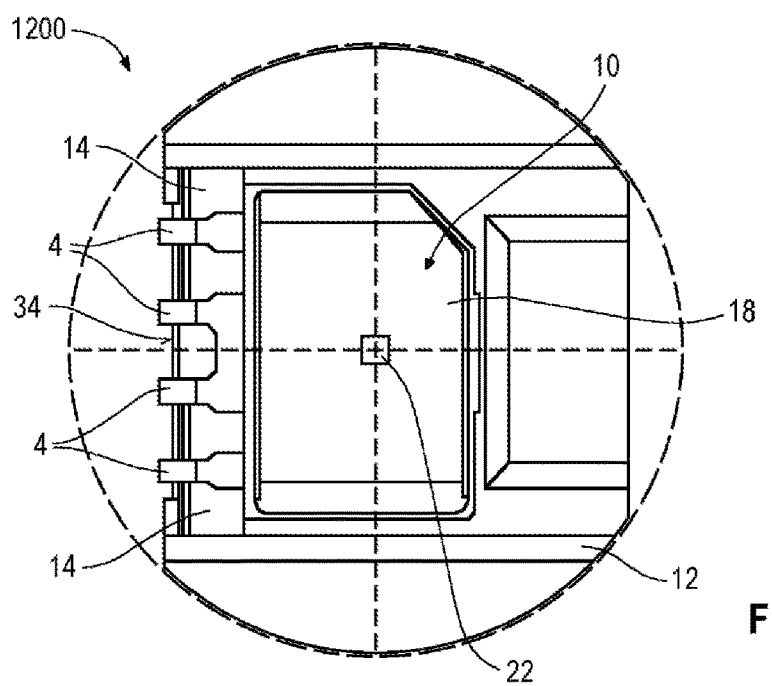
FIG. 12 shows a plan view of a sensor device 1200 in accordance with the disclosure.

The sensor device 1200 in FIG. 12 can be similar to the sensor device 1100 in FIGS. 11A-11C. In the plan view in FIG. 12, the passive component 16 and sections of the connection conductors 4 can be arranged behind the magnet 12 and concealed by the latter. By way of example, the sensor device 1200 or the magnet 12 can be arranged in a cylindrical module, indicated by a dashed circle in FIG. 12. In this case, an internal diameter of the module can be in a range of approximately 9 mm to approximately 10 mm, for example. A typical value of the internal diameter can be 9.7 mm, for example.

It is evident from the plan view in FIG. 12 that the sensor element 22 of the magnetic field sensor chip or of the magnetic field sensor component 10 can be arranged on a cylinder axis of the cylindrical magnet 12. The sensor element 22 can be a mono-Hall sensor element, in particular. The arrangement of the sensor element 22 on the cylinder axis can provide a TIM (Twist Insensitive Mounting) functionality of the sensor device 1200. That is to say that the sensor output signal of a sensor device in accordance with the disclosure can, in a wide range, have TIM capability and be independent of torsion about the z axis.

The sensor element 22 can be arranged over the hole 32 of the magnet 12, said hole being concealed by the magnetic field sensor component 10 in the plan view in FIG. 12. The magnet 12 can furthermore have a flattened side surface 34. The connection conductors 4 can be arranged in a space-saving manner in the volume formed by the flattened side surface 34 and the inner surface of the module. In comparison therewith, only smaller magnets can be realized with standard ring magnets for an identical shape or contour of the module. In other words, smaller internal radii can be realized in the case of modules having sensor devices in accordance with the disclosure. In comparison with a standard ring magnet that fits into a module having an identical diameter, a use of the magnet 12 having the geometry shown can provide a low magnetic offset and at the same time maintain a high magnetic signal modulation.

Figure 13:
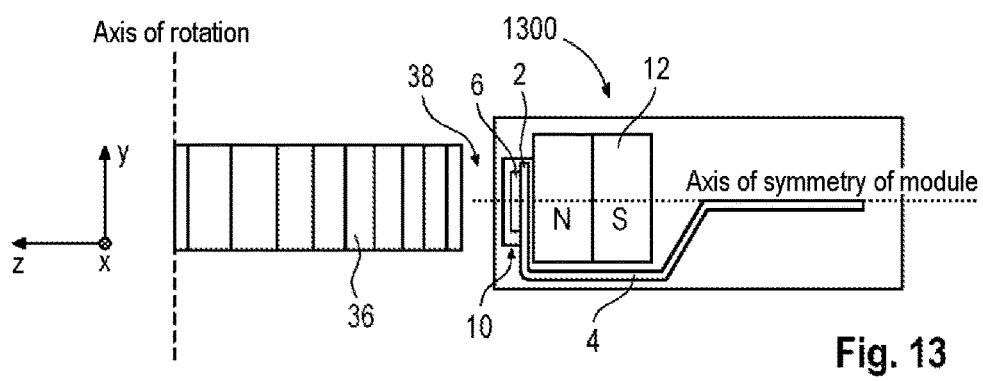
FIG. 13 shows a side view of a sensor device 1300 in accordance with the disclosure.

The sensor device 1300 in FIG. 13 can be similar to one of the sensor devices in FIGS. 1 and 11, for example. The sensor device 1300 or the magnetic field sensor component 10 can be arranged relative to an encoder element 36. The encoder element 36 can be a ferromagnetic wheel, for example, which can be designed to rotate about an axis extending in the y-direction. In the example in FIG. 13, this can involve a ferromagnetic toothed wheel, in particular, which can be designed as a camshaft wheel. The text hereinafter may therefore also refer to a camshaft wheel or camshaft target wheel. In further examples, other components can have the function of an encoder element 36, such as multi-pole magnets, for example. The magnetic field sensor component 10 and the encoder element 36 can be separated from one another by an air gap 38.

The magnetic field sensor component 10 can be designed to detect at least one from a speed of the encoder element 36 or a position of the encoder element 36. The magnet 12 can provide a supporting field for the magnetic field sensor chip 6 or its sensor element (not shown). On account of the nonuniform shape of the encoder element 36 or of the ferromagnetic toothed wheel in FIG. 13, during a rotation of the encoder element 36, the magnetic field detected by the magnetic field sensor chip 6 can change and the magnetic field sensor chip 6 can generate output pulses. The output pulses can be passed on to a logical integrated circuit (e.g. an ASIC) or a control unit (e.g. an ECU, Electronic Control Unit), which can count the output pulses and calculate the speed of the rotating encoder element 36. Furthermore, the position of the encoder element 36 can be deduced on the basis of the shape of the output pulses. In general, the arrangement in FIG. 13 can be used for example in automotive applications for determining wheel speeds, for example in safety-relevant applications such as e.g. ABS (antilock braking system), engines, or transmissions. In particular, the sensor device 1300 can be designed to detect a camshaft rotational speed.

Figure 15:
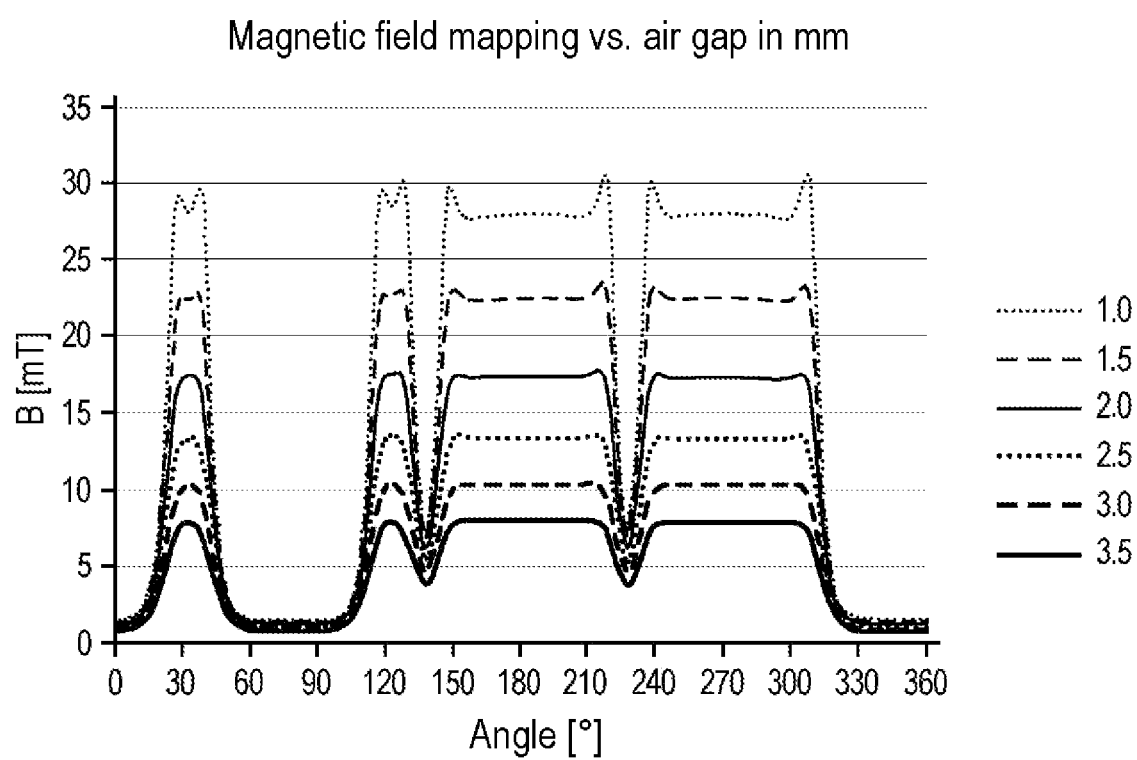
FIG. 15 shows magnetic field strengths detected by a sensor device in accordance with the disclosure as a function of the angle of rotation of an encoder element for air gaps of various sizes.

As mentioned above, the magnetic field sensor chip 6 can generate output pulses that can be counted by a control unit. On the basis of this information, the control unit can calculate the position of the toothed wheel or of a rotating shaft. One important feature of camshaft position sensing is the "True Power-On" functionality. That means that the control unit has to know the exact target wheel position directly when the engine starts. In other words, the magnetic field sensor chip 6 has to provide information about whether it is situated opposite a tooth or a notch of a rotating camshaft target wheel. In order to provide this function with high reliability, a low magnetic offset produced by the premagnetization magnet 12 may be desirable. The low magnetic offset (ideally 0 mT) can result in a low absolute drift of the magnetic field over temperature fluctuations and lifetime. When the sensor device is mounted in front of a target wheel, the signal will be at a maximum in the center of the tooth and at a minimum in the center of the notch. Exemplary profiles of detected magnetic field signals are shown in FIG. 15. At the notches, the signals will be constantly low, close to 0 mT offset, independently of the air gap 38. This makes it possible to introduce a fixed threshold value for the decision "tooth" or "notch". Magnets with this low offset may also be referred to as "zero gauss magnet". An axially magnetized cylinder may be regarded as the simplest form of a zero gauss magnet. Sensor devices in accordance with the disclosure or the magnets contained therein can constitute cost-effective implementations of zero gauss magnets.

Figure 14A:
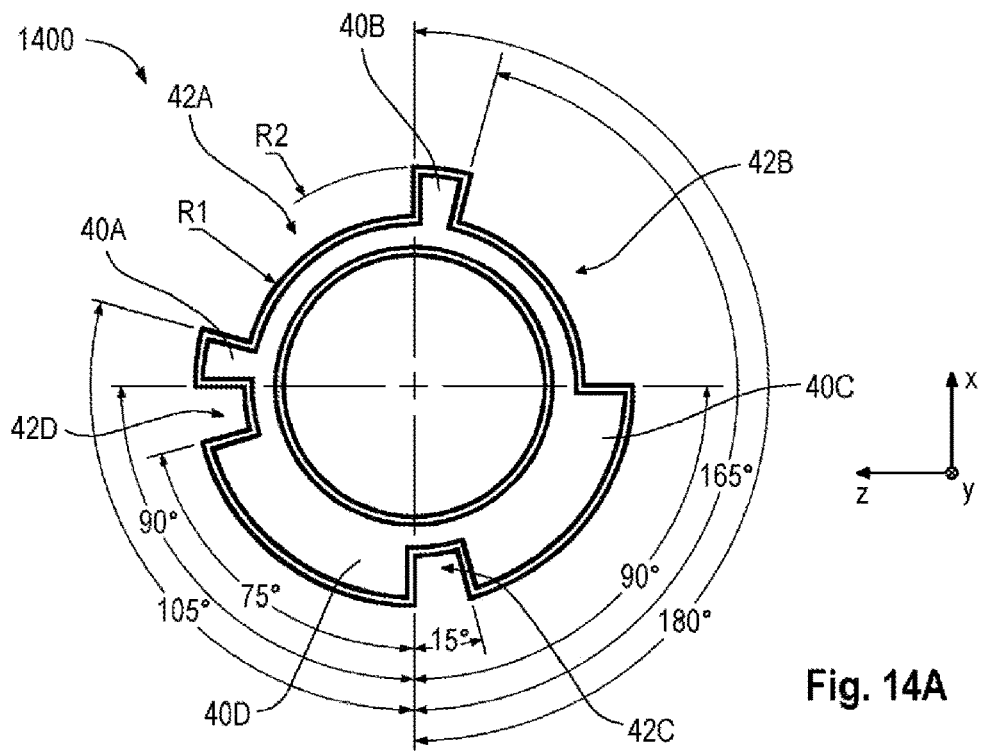
FIGS. 14A to 14C show different views of an encoder element 1400 that can be used in a sensor device in accordance with the disclosure.
Figure 14B:
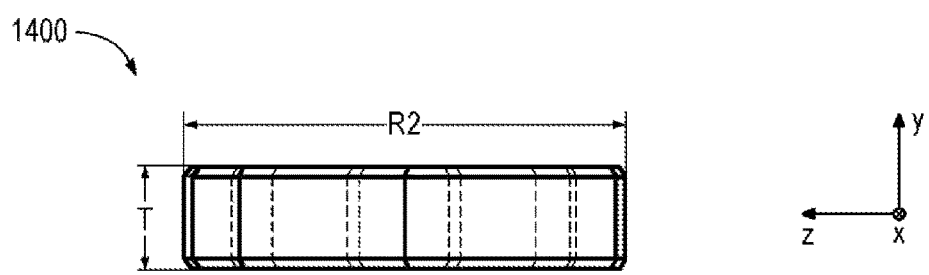
Figure 14C:
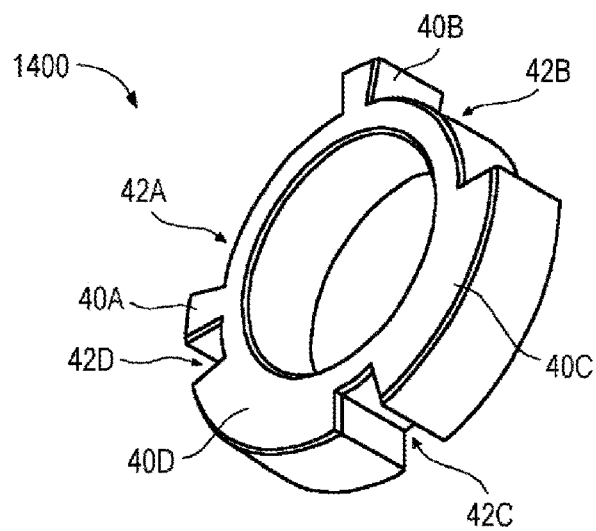

The encoder element 1400 in FIGS. 14A-14C can for example be similar to the encoder element 36 in FIG. 13 and be used in the sensor device 1300. In the example in FIGS. 14A-14C, the encoder element 1400 can be a ferromagnetic toothed wheel. The toothed wheel in FIGS. 14A-14C can have four teeth 40A-40D and four notches 42A-42D, for example. The teeth 40A, 40B and the teeth 40C, 40D can each have an identical shape. The teeth 40A, 40B can have smaller dimensions than the teeth 40C, 40D. The same correspondingly applies to the notches 42A-42D arranged between the teeth 40A-40B. Exemplary dimensions of the teeth and notches of the encoder element 36 are indicated in the form of angles in the plan view in FIG. 14A.

FIG. 15 shows magnetic field strengths detected by a sensor device in accordance with the disclosure as a function of the angle of rotation of an encoder element for air gaps of various sizes. By way of example, the magnetic fields can be detected by a sensor device and an encoder element such as are shown in FIGS. 13, 14A, 14B, and 14C. The various curves show the detected magnetic field strengths for one revolution of the encoder element with air gap sizes of 1.0 mm, 1.5 mm, 2.0 mm, 2.5 mm, 3.0 mm and 3.5 mm. Each of the curves illustrated exhibits two narrow and two wide plateaus, which can be assigned to the corresponding teeth of the encoder element. If a tooth of the encoder element is situated opposite the sensor device, an increased value of the magnetic field can be detected. On account of the above-described geometry of the magnet 12 with the hole 32, a respective plateau extending over a wide or broad range arises for each of the teeth of the encoder element. Moreover, for example in the case of an angle of approximately 75°, a low value for the offset of the magnetic field can be discerned.

EXAMPLES

Sensor devices and methods for producing sensor devices are explained below on the basis of examples.

Example 1 is a sensor device, comprising: a magnetic field sensor component, comprising a chip carrier having a connection conductor and a magnetic field sensor chip arranged on the chip carrier; and a magnet, wherein the magnetic field sensor component is arranged on a mounting surface of the magnet, wherein the mounting surface has an elevation and the connection conductor is bent around the elevation.

Example 2 is a sensor device according to Example 1, wherein the connection conductor bears on the elevation.

Example 3 is a sensor device according to Example 1 or 2, wherein the elevation is embodied in the shape of a beam and extends along a marginal region of the mounting surface.

Example 4 is a sensor device according to Example 1 or 2, wherein the elevation is embodied in the shape of a frame and extends around the mounting surface.

Example 5 is a sensor device according to any of the preceding examples, wherein the elevation has a rounded edge and the connection conductor is bent around the rounded edge.

Example 6 is a sensor device according to any of the preceding examples, wherein: the mounting surface has a plurality of elevations, and the chip carrier has a plurality of connection conductors, wherein each of the plurality of connection conductors is bent around one of the plurality of elevations.

Example 7 is a sensor device according to any of Examples 1 to 5, wherein: the elevation is embodied in one piece, and the chip carrier has a plurality of connection conductors, wherein each of the plurality of connection conductors is bent around the one-piece elevation.

Example 8 is a sensor device according to any of the preceding examples, wherein the magnet and the elevation are fabricated as a one-piece integral part.

Example 9 is a sensor device according to any of Examples 1 to 7, wherein the magnet and the elevation consist of two parts joined together.

Example 10 is a sensor device according to any of the preceding examples, wherein the mounting surface has a depression and the magnetic field sensor component is arranged in the depression.

Example 11 is a sensor device according to any of the preceding examples, wherein the magnet is embodied as cylinder, and a sensor element of the magnetic field sensor component is arranged on a cylinder axis.

Example 12 is a sensor device according to Example 11, wherein the lateral surface of the cylindrical magnet is flattened and the connection conductor extends along the flattened lateral surface.

Example 13 is a sensor device according to Example 11 or 12, wherein the magnet has a hole extending along the cylinder axis.

Example 14 is a sensor device according to any of the preceding examples, wherein the magnetic field sensor component is arranged relative to an encoder element, the magnetic field sensor component is designed to detect at least one from a speed of the encoder element or a position of the encoder element, and the magnetic field sensor component and the encoder element are separated by an air gap.

Example 15 is a sensor device according to any of the preceding examples, wherein the magnetic field sensor component is designed to detect a camshaft rotational speed.

Example 16 is a sensor device according to any of the preceding examples, wherein the magnetic field sensor component comprises a mono-Hall sensor element.

Example 17 is a sensor device, comprising: a magnetic field sensor component, comprising a chip carrier having a connection conductor and a magnetic field sensor chip arranged on the chip carrier; and a magnet, wherein the magnetic field sensor component is arranged on a mounting surface of the magnet, wherein the mounting surface has a depression and the magnetic field sensor component is arranged in the depression.

Example 18 is a sensor device according to Example 17, wherein, on account of the arrangement of the magnetic field sensor component in the depression, one or more of a translation or a rotation of the magnetic field sensor component in the mounting surface is substantially blocked.

Example 19 is a sensor device according to Example 17 or 18, wherein a basic area of the depression and a basic area of the magnetic field sensor component are substantially congruent.

Example 20 is a sensor device according to any of Examples 17 to 19, wherein the magnetic field sensor component is completely surrounded by side walls of the depression.

Example 21 is a method for producing a sensor device, wherein the method comprises: providing a magnetic field sensor component, comprising a chip carrier having a connection conductor and a magnetic field sensor chip arranged on the chip carrier; arranging the magnetic field sensor component on a mounting surface of a magnet, wherein the mounting surface has an elevation; and bending the connection conductor around the elevation of the mounting surface.

Although specific embodiments have been illustrated and described herein, it is obvious to the person of average skill in the art that a multiplicity of alternative and/or equivalent implementations can replace the specific embodiments shown and described, without departing from the scope of the present disclosure. This application is intended to cover all adaptations or variations of the specific embodiments discussed herein. Therefore, the intention is for this disclosure to be restricted only by the claims and the equivalents thereof.

What is claimed is:

1. A sensor device, comprising:
   a magnetic field sensor component comprising a chip carrier having a connection conductor and a magnetic field sensor chip arranged on the chip carrier; and
   a magnet comprising a mounting surface, wherein the magnetic field sensor component is arranged on the mounting surface of the magnet using an adhesive layer,
   wherein the mounting surface of the magnet has at least a first portion and a second portion,
   wherein the magnet comprises walls defining the first portion and configured to protect the adhesive layer from shear forces,
   wherein the magnetic field sensor component is arranged on the first portion of the mounting surface,
   wherein the second portion is an elevation that protrudes from the first portion of the mounting surface,
   wherein the connection conductor extends from the chip carrier and is bent around the elevation formed by the second portion of the mounting surface, and
   wherein the elevation reduces stress on the connection conductor during bending of the connection conductor around the elevation.

2. The sensor device as claimed in claim 1, wherein the connection conductor bears on the elevation such that an underside of the connection conductor is mechanically contacted with a top side of the elevation.

3. The sensor device as claimed in claim 1, wherein the elevation is embodied in a shape of a beam and extends along a marginal region of the mounting surface.

4. The sensor device as claimed in claim 1, wherein the elevation has a rounded edge and the connection conductor is bent around the rounded edge.

5. The sensor device as claimed in claim 1 wherein:
   the elevation is a one-piece elevation, and
   the chip carrier has a plurality of connection conductors, wherein each of the plurality of connection conductors is bent around the one-piece elevation.

6. The sensor device as claimed in claim 1, wherein the magnet and the elevation are fabricated as a one-piece integral member.

7. The sensor device as claimed in claim 1, wherein the magnet and the elevation consist of two parts joined together.

8. The sensor device as claimed in claim 1, wherein the first portion of the mounting surface is a depression and the magnetic field sensor component is arranged in the depression.

9. The sensor device as claimed in claim 1, wherein the magnet is embodied as a cylindrical magnet, and a sensor element of the magnetic field sensor component is arranged on a cylinder axis of the cylindrical magnet.

10. The sensor device as claimed in claim 9, wherein a lateral surface of the cylindrical magnet is flattened and the connection conductor extends along the lateral surface.

11. The sensor device as claimed in claim 9, wherein the magnet has a hole extending along the cylinder axis.

12. The sensor device as claimed in claim 1, wherein:
   the magnetic field sensor component is arranged relative to an encoder element,
   the magnetic field sensor component is configured to detect at least one of a speed of the encoder element or a position of the encoder element, and
   the magnetic field sensor component and the encoder element are separated by an air gap.

13. The sensor device as claimed in claim 1, wherein the magnetic field sensor component is configured to detect a camshaft rotational speed.

14. The sensor device as claimed in claim 1, wherein the magnetic field sensor component comprises a mono-Hall sensor element.

15. The sensor device as claimed in claim 1, wherein the connection conductor is a one-piece integral part.

16. A sensor device, comprising:
   a magnetic field sensor component comprising a chip carrier having a connection conductor and a magnetic field sensor chip arranged on the chip carrier; and
   a magnet comprising a mounting surface, wherein the magnetic field sensor component is arranged on the mounting surface of the magnet,
   wherein the mounting surface of the magnet has at least a first portion and a second portion,
   wherein the magnetic field sensor component is arranged on the first portion of the mounting surface,
   wherein the second portion is an elevation that protrudes from the first portion of the mounting surface,
   wherein the connection conductor extends from the chip carrier and is bent around the elevation formed by the second portion of the mounting surface,
   wherein the mounting surface has a plurality of elevations that protrude from the first portion of the mounting surface, and
   wherein the chip carrier has a plurality of connection conductors comprising a first group of connection conductors and a second group of connection conductors, wherein each connection conductor of the first group of connection conductors is bent around a first elevation of the plurality of elevations and each connection conductor of the second group of connection conductors is bent around a second elevation of the plurality of elevations.

17. A method for producing a sensor device, wherein the method comprises:
providing a magnetic field sensor component comprising a chip carrier having a connection conductor and a magnetic field sensor chip arranged on the chip carrier;
arranging the magnetic field sensor component on a mounting surface of a magnet using an adhesive layer, wherein the mounting surface of the magnet has at least a first portion and a second portion, the magnet comprises walls defining the first portion and configured to protect the adhesive layer from shear forces, and wherein the second portion is an elevation that protrudes from the first portion of the mounting surface; and
bending the connection conductor around the elevation of the mounting surface, wherein the connection conductor extends from the chip carrier and is bent around the elevation formed by the second portion of the mounting surface, and wherein the elevation reduces stress on the connection conductor during bending of the connection conductor around the elevation.

* * * * *